US012745472B2

(12) United States Patent
Lin et al.

(10) Patent No.: US 12,745,472 B2
(45) Date of Patent: Sep. 22, 2026

(54) IMAGE SENSOR HAVING META-SURFACE LAYER WITH META-STRUCTURES

(71) Applicant: VisEra Technologies Company Limited, Hsin-Chu City (TW)

(72) Inventors: Cheng-Hsuan Lin, Hsin-Chu City (TW); Chun-Yuan Wang, Hsin-Chu City (TW); Po-Hsiang Wang, Hsin-Chu City (TW)

(73) Assignee: VisEra Technologies Company Limited, Hsin-Chu City (TW)

( * ) Notice: Subject to any disclaimer, the term of this patent is extended or adjusted under 35 U.S.C. 154(b) by 381 days.

(21) Appl. No.: 18/543,138

(22) Filed: Dec. 18, 2023

(65) Prior Publication Data

US 2025/0204070 A1 Jun. 19, 2025

(51) Int. Cl.
*H10F 39/00* (2025.01)

(52) U.S. Cl.
CPC ....... *H10F 39/806* (2025.01); *H10F 39/8053* (2025.01)

(58) Field of Classification Search
CPC .. H10F 39/806; H10F 39/8053; H10F 39/805; H10F 39/8063
See application file for complete search history.

(56) References Cited

U.S. PATENT DOCUMENTS

2017/0153339 A1* 6/2017 Hong ........................ G01T 1/36
2021/0126035 A1* 4/2021 Roh ........................ G02B 1/002
2023/0352506 A1* 11/2023 Ahn ........................ H10F 39/806
2024/0243147 A1* 7/2024 Ahn ........................ H10F 39/806
2025/0280616 A1* 9/2025 Roh ........................ G02B 3/0056

FOREIGN PATENT DOCUMENTS

CN 102693997 A 9/2012
CN 114695408 A 7/2022
TW 200511570 A 3/2005
TW 202316649 A 4/2023
WO 2023195316 A1 10/2023

* cited by examiner

*Primary Examiner* — J.E. Schoenholtz
(74) *Attorney, Agent, or Firm* — MUNCY, GEISSLER, OLDS & LOWE, P.C.

(57) ABSTRACT

An image sensor includes an array of pixels, each of the pixels includes a sensor layer and a color filter layer disposed on the sensor layer. Each of the pixels further includes a first meta-surface layer disposed over the color filter layer and a second meta-surface layer disposed on the first meta-surface layer. The second meta-surface layer has a meta-structure region corresponding to each of the pixels. The shifting value S1 between the center of the color filter layer and the center of the sensor layer, the shifting value S2 between the center of the first meta-surface layer and the center of the sensor layer, and the shifting value S3 between the center of the second meta-surface layer and the center of the sensor layer all increase with the distance from the center of the image sensor.

18 Claims, 12 Drawing Sheets

IMAGE SENSOR HAVING META-SURFACE LAYER WITH META-STRUCTURES

BACKGROUND OF THE INVENTION

Field of the Invention

The present disclosure relates to an image sensor, and in particular to an image sensor with a meta-surface layer.

Description of the Related Art

Image sensors, such as complementary metal oxide semiconductor (CMOS) image sensors (also known as CIS), are widely used in various image-capturing apparatuses such as digital still-image cameras, digital video cameras, and the like. The light-sensing portion of the image sensor may detect ambient color change, and signal electric charges may be generated depending on the amount of light received in the light-sensing portion. In addition, the signal electric charges generated in the light-sensing portion may be transmitted and amplified, whereby an image signal is obtained.

Recently, meta-surfaces have garnered significant attention in the field of optics. For example, meta-surfaces may be used in conjunction with image sensors (such as a CMOS image sensor). These meta-surfaces are capable of manipulating the properties of electromagnetic waves (e.g. the incident wave). For example, the meta-surfaces may be used as lenses, polarizers, beam-shaping devices, and tunable phase modulators. Also, the meta-surfaces may be designed to correct aberrations including spherical aberrations, chromatic aberrations, etc. Therefore, image quality may be enhanced.

However, existing meta-surfaces have not been satisfactory in various respects. In order to maintain a high level of product performance, the industry needs to improve these meta-surfaces to achieve their desired goal of maintaining the yield of the image sensor.

BRIEF SUMMARY OF THE INVENTION

An embodiment of the present disclosure provides an image sensor that includes an array of pixels. Each of the pixels includes a sensor layer and a color filter layer disposed on the sensor layer. Each of the pixels further includes a first meta-surface layer disposed over the color filter layer and a second meta-surface layer disposed on the first meta-surface layer. The second meta-surface layer has a meta-structure region corresponding to each of the pixels. The shifting value S1 between the center of the color filter layer and the center of the sensor layer, the shifting value S2 between the center of the first meta-surface layer and the center of the sensor layer, and the shifting value S3 between the center of the second meta-surface layer and the center of the sensor layer all increase with the distance from the array center.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
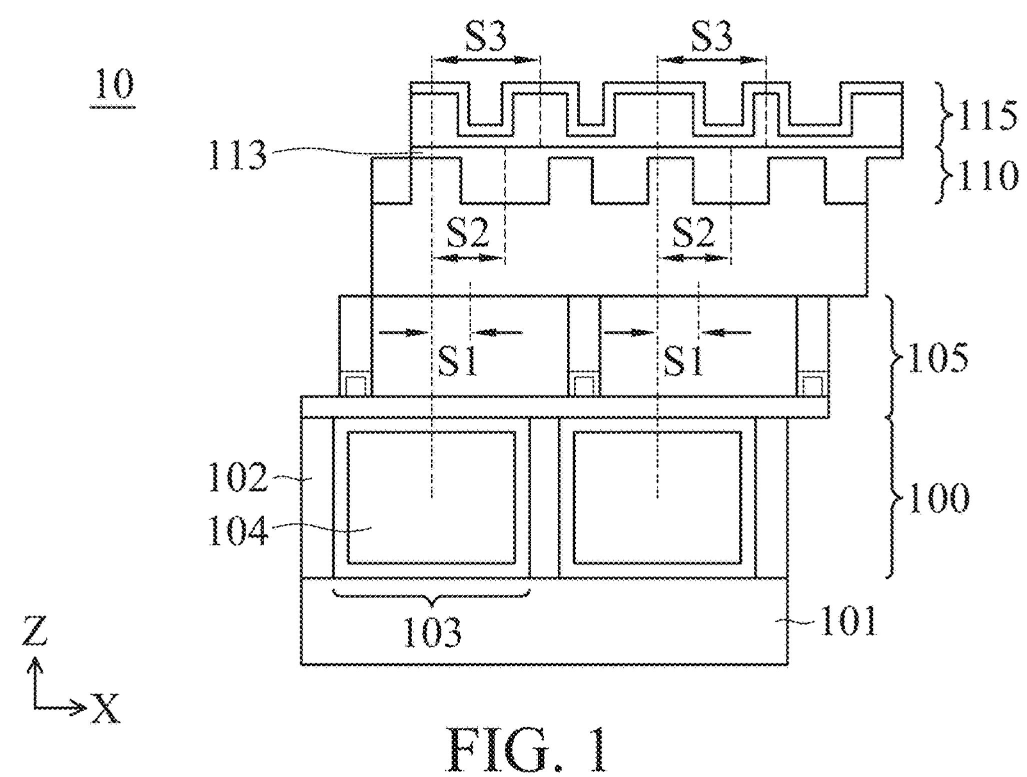
FIG. 1 illustrates a cross-sectional view of the image sensor according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during the manufacturing process, as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

In conventional configurations, due to the different distances between the center and edges of the meta-surface layer and the light source, the meta-surface layer needs to be designed with additional shifts to ensure the receiving of the sensor. The embodiment of the present disclosure provides a novel design of the meta-surface layer, including an additional global shifting, an additional inner shifting, and an additional angle rotation of the meta-surface layer, such that the photodiodes in the center and edges of the image sensor may have the same sensing ability.

FIG. 1 illustrates a cross-sectional view of the image sensor 10 according to some embodiments of the present disclosure. In some embodiments, the image sensor 10 includes an array of pixels 103. In some embodiments, each of the pixels includes a sensor layer 100, a color filter layer 105, a first meta-surface layer 110, and a second meta-surface layer 115. In some embodiments, the sensor layer 100 may form on a substrate 101. In some embodiments, the substrate 101 may be an elemental semiconductor including silicon or germanium; a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb); an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy; or a combination thereof. In some embodiments, the substrate 101 may be a photoelectric conversion substrate, for example, silicon substrate or organic photoelectric conversion layer. In other embodiments, the substrate 101 may also be a semiconductor on insulator (SOI) substrate. The semiconductor on insulator substrate may include a base plate, a buried oxide layer disposed on the base plate, and a semiconductor layer disposed on the buried oxide layer. Furthermore, the substrate 101 may be an N-type or a P-type conductive type.

In some embodiments, each of the pixels includes a light-shielding layer 102 and a sensor component 104. The light-shielding layer 102 may define the region of the sensor component 104. The sensor component 104 may include sensing unit, such as photodiodes, which may convert received light signals into electric signals. In some embodiments, the light-shielding layer 102 may have a lower refractive index than the sensor component 104. The refractive index is a characteristic of a substance that changes the speed of light, and is a value obtained by dividing the speed of light in vacuum by the speed of light in the substance. When light travels between two different materials at an angle, its refractive index determines the angle of light transmission (refraction). When incident light enters the sensor layer 100, the light-shielding layer 102 may isolate light rays within the specific unit to serve as the light-trapping function. In some embodiments, the material of the light-shielding layer 102 may include a transparent dielectric material.

Referring to FIG. 1, the color filter layer 105 is disposed on the sensor layer 100. In some embodiments, the height of the color filter layer 105 may be between approximately 0.3 μm and 2.0 μm. In a particular embodiment, the height of the color filter layer 105 may be approximately 0.9 μm. In some embodiments, the color filter layer 105 may be red color filter segment, green color filter segment, blue color filter segment, yellow color filter segment, white color filter segment, cyan color filter segment, magenta color filter segment, or infrared (IR)/near infrared (NIR) color filter segment. In some embodiments, the color filter layer 105 may be formed in sequence by a coating, exposure, and development process at different steps. Alternatively, the color filter layer 105 may be formed by ink-jet printing.

Referring to FIG. 1, in some embodiments, the first meta-surface layer 110 is disposed over the color filter layer 105. In some embodiments, the second meta-surface layer 115 is disposed on the first meta-surface layer 110. The first meta-surface layer 110 and the second meta-surface layer 115 may provide several optical functionalities, such as phase correction and aberration correction. When the first meta-surface layer 110 and the second meta-surface layer 115 are used as the phase corrector, the phase of the incident wave may be modulated. When the first meta-surface layer 110 and the second meta-surface layer 115 are used as the aberration corrector, the performance of the image sensor 10 and/or the image quality may be improved. That is, when light is emitted into the image sensor 10, due to the usage of the first meta-surface layer 110 and the second meta-surface layer 115, the light-collecting efficiency may be enhanced, and the possibility of image distortion may be effectively reduced. In some embodiments, the second meta-surface layer 115 has a meta-structure region 125 corresponding to each of the pixels 103. This is described in more detail below. In some embodiments, examples of the material of the first meta-surface layer 110 and the second meta-surface layer 115 may include a dielectric material, a metal material, and the like. For example, the first meta-surface layer 110 and the second meta-surface layer 115 may be made of carbon nanotubes (CNTs), two-dimensional transition metal dichalcogenides (2D TMDs), SiC, $ZrO_2$, $TiO_x$, $SiN_x$, Indium Tin Oxides (ITO), Si, amorphous Si, polycrystalline Si, a III-V semiconductor compound, or a combination thereof. In some embodiments, the refractive index of the first meta-surface layer 110 is about 1.6 to 2.6. In some embodiments, the refractive index of the second meta-surface layer 115 is about 1.6 to 2.6. In some embodiments, the image sensor further includes an internal space layer 113 disposed between the first meta-surface layer 110 and the second meta-surface layer 115. In some embodiments, the refractive index of the internal space layer 113 is the same as the refractive index of the first meta-surface layer 110. In some embodiments, the refractive index of the internal space layer 113 is the same as the refractive index of the second meta-surface layer 115.

Referring to FIG. 1, in some embodiments, there is a shifting value S1 between the center of the color filter layer 105 and the center of the sensor layer 100. In some embodiments, there is a shifting value S2 between the center of the first meta-surface layer 110 and the center of the sensor layer 100. In some embodiments, there is a shifting value S3 between the center of the second meta-surface layer 115 and the center of the sensor layer 100. In some embodiments, the shifting value S1, the shifting value S2, and the shifting value S3 increase with the distance from the array center 120. This is described in more detail below. In some embodiments, the shifting value S1 is less than the shifting value S2. In some embodiments, the shifting value S2 is less than the shifting value S3.

Figure 2:
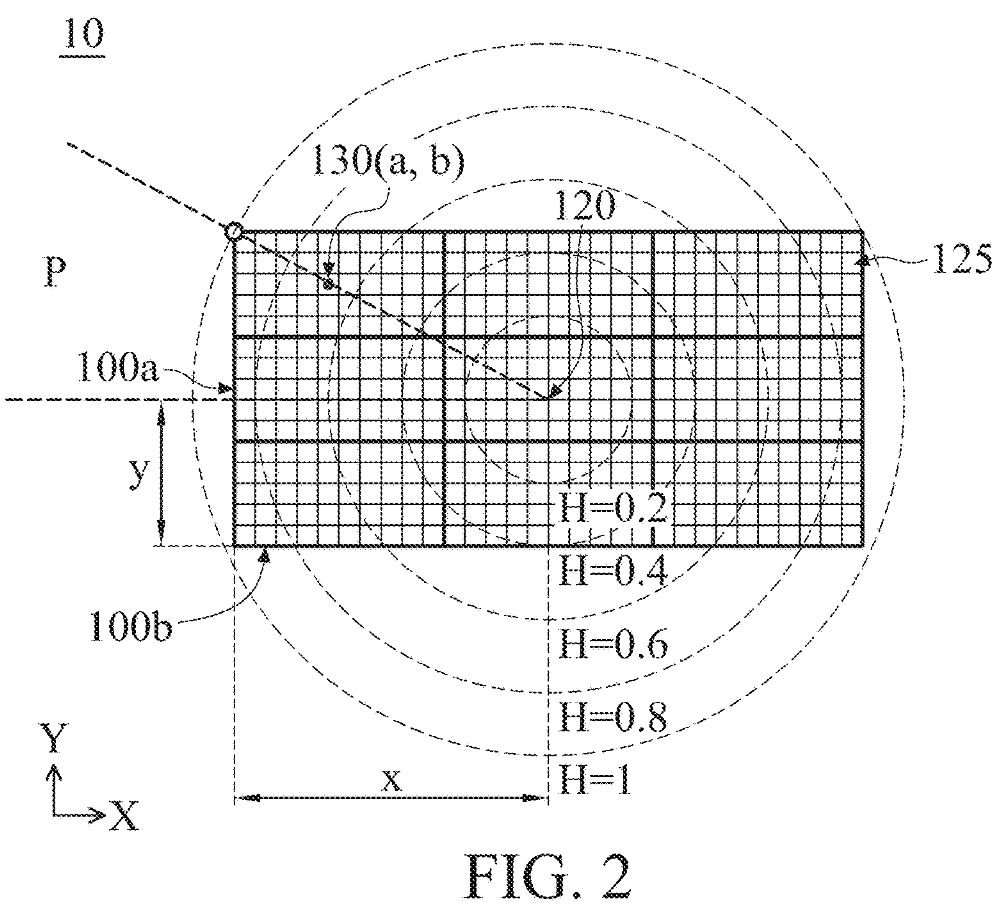
FIG. 2 illustrates a top view of the image sensor according to some embodiments of the present disclosure.

FIG. 2 illustrates a top view of the image sensor 10 according to some embodiments of the present disclosure. In some embodiments, the shifting value S1, the shifting value S2, and the shifting value S3 satisfy the following equations (1), (2-1), (2-2), and (2-3):

$$H = \sqrt{a^2 + b^2} / \sqrt{x^2 + y^2} \quad (1)$$

$$S1 = H * Z(1) \quad (2\text{-}1)$$

$$S2 = H * Z(2) \quad (2\text{-}2)$$

$$S3 = H * Z(3) \quad (2\text{-}3)$$

Wherein x is the distance from the array center 120 to the array boundary 100*a* in the first direction X, y is the distance from the array center 120 to the array boundary 100*b* in the second direction Y, a is a distance from the center 130 of the meta-structure region 125 (also shown in FIG. 3) to the array center 120 in the first direction X, b is a distance from the center 130 from the meta-structure region 125 to the array center 120 in the second direction Y, H is the percentage of shift, Z(1) is the shifting constant of the color filter layer 105, Z(2) is the shifting constant of the first meta-surface layer 110, Z(3) is the shifting constant of the second meta-surface layer 115, and the first direction X is perpendicular to the second direction Y. In some embodiments, the coordinate a is less than the distance x, and the coordinate b is less than the distance y. More specifically, the greater the distance between the center 130 of the meta-structure region 125 and the array center 120, the greater the shifting value. In some embodiments, Z(3) is greater than Z(1) and Z(2), and Z(3) satisfies Z(3)≤1.2*PS, and PS is the dimension of each of the pixels 103. In some embodiments, H is from 0 to 1, grouped into 100 sections at most. For example, FIG. 2 illustrates several circles, which represent H=0.2, H=0.4, H=0.6, H=0.8, or H=1.

Figure 3:
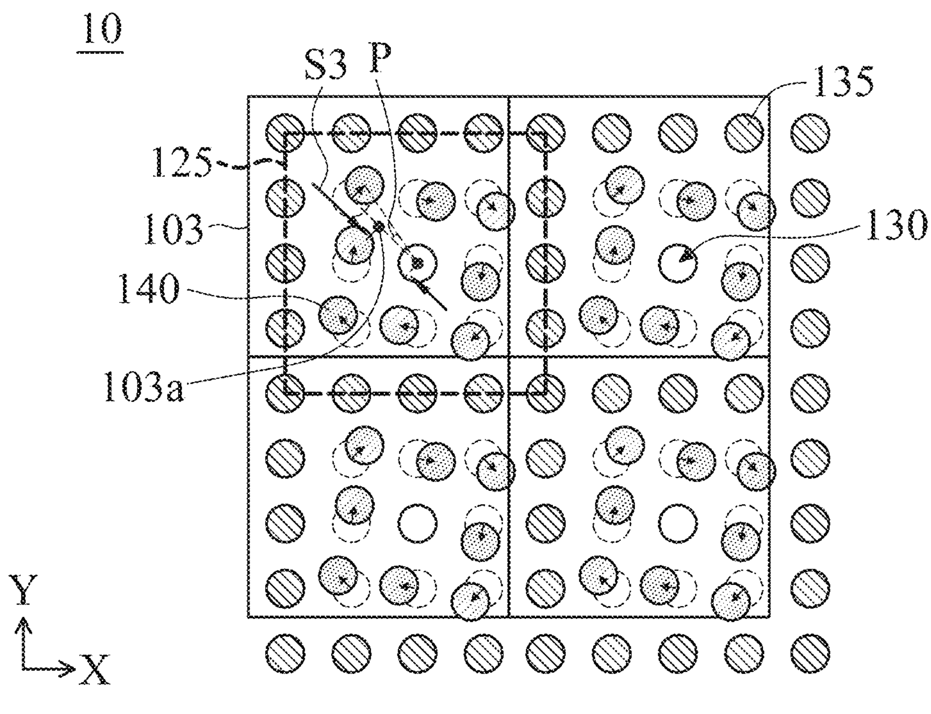
FIG. 3 illustrates a fragmentary top view of the image sensor according to some embodiments of the present disclosure.

Referring to FIG. 2 and in conjunction with FIG. 3, FIG. 3 illustrates a fragmentary top view of the image sensor 10 according to some embodiments of the present disclosure. In some embodiments, a plurality of meta-structures 135 (shown in FIG. 3) in the meta-structure region 125 may rotate at an angle P, and the angle P satisfies the following equation (3):

$$P = \tan^{-1}\frac{b}{a}, \text{ when } a > 0 \quad (3)$$

-continued $$P = 90, \text{ when } a = 0 \text{ and } b > 0$$

$$P = 270, \text{ when } a = 0 \text{ and } b < 0$$

In some embodiments, the first set 140 of the meta-structures 135 is rotated at the angle P around the center 130 of the meta-structure region 125. By designing the rotation angle, the second meta-surface layer 115 may further improve the performance of the image sensor 10 and/or the image quality. In some embodiments, the count of the meta-structure region 125 is corresponding to the count of the pixels 103. In some embodiments, the shifting value S3 is corresponding to the distance between the center 130 of the meta-structure region 125 and a center 103*a* of each of the pixels 103.

Figure 4A:
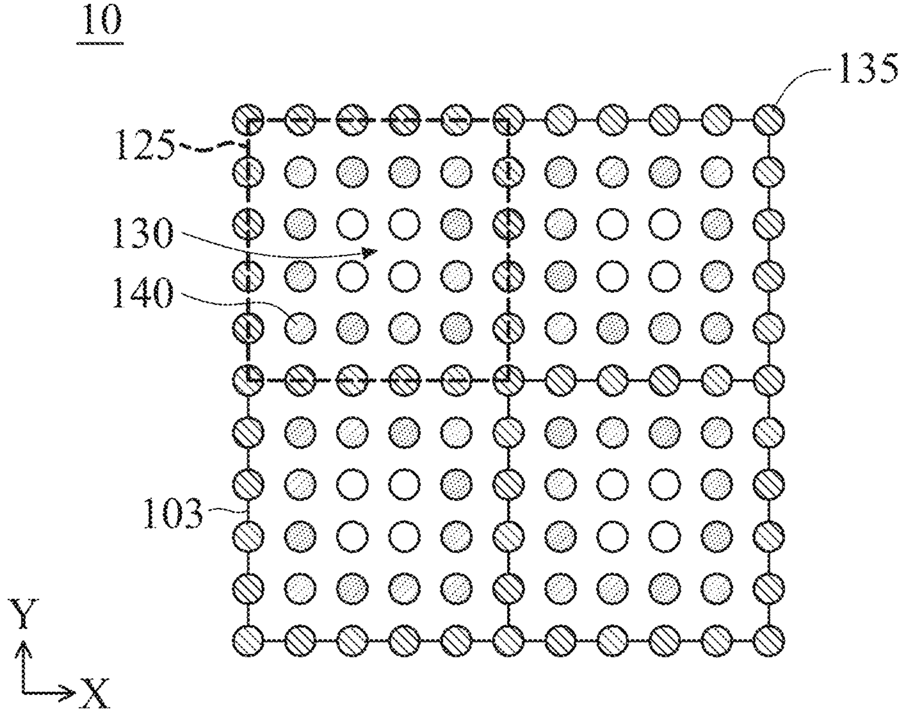
FIGS. 4A, 4B, and 4C illustrate fragmentary top views of the image sensor according to some embodiments of the present disclosure.
Figure 4B:
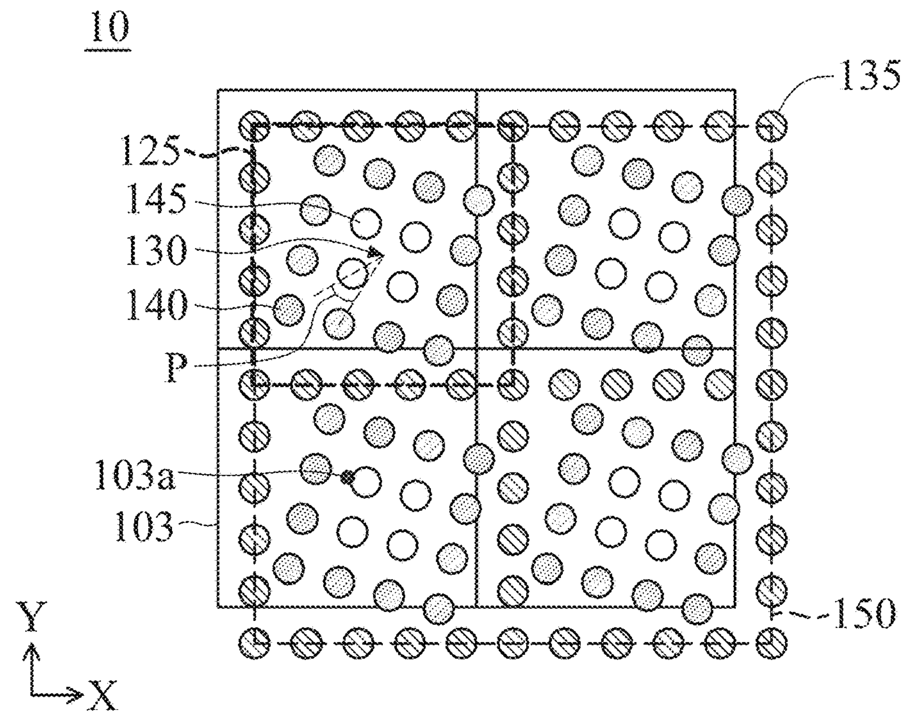
Figure 4C:
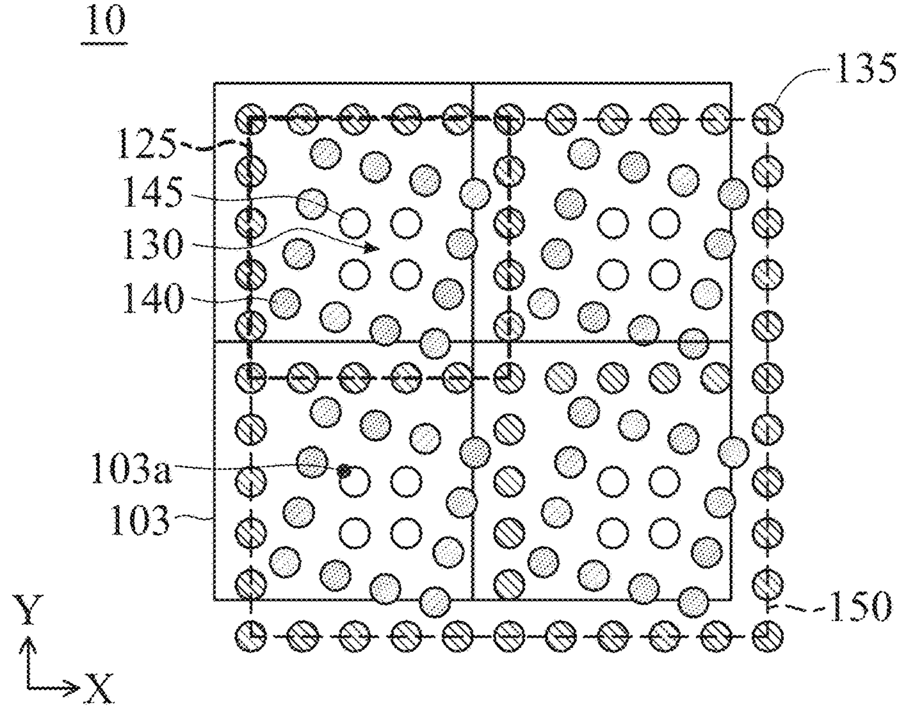
Figure 5A:
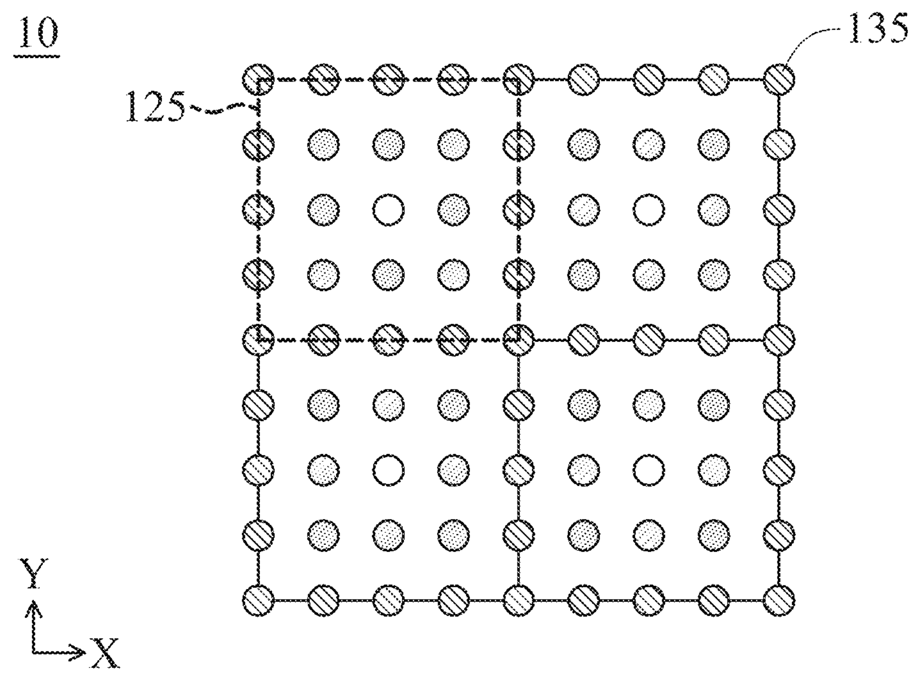
FIGS. 5A, 5B, 5C, and 5D illustrate fragmentary top views of the image sensor according to some embodiments of the present disclosure.
Figure 5B:
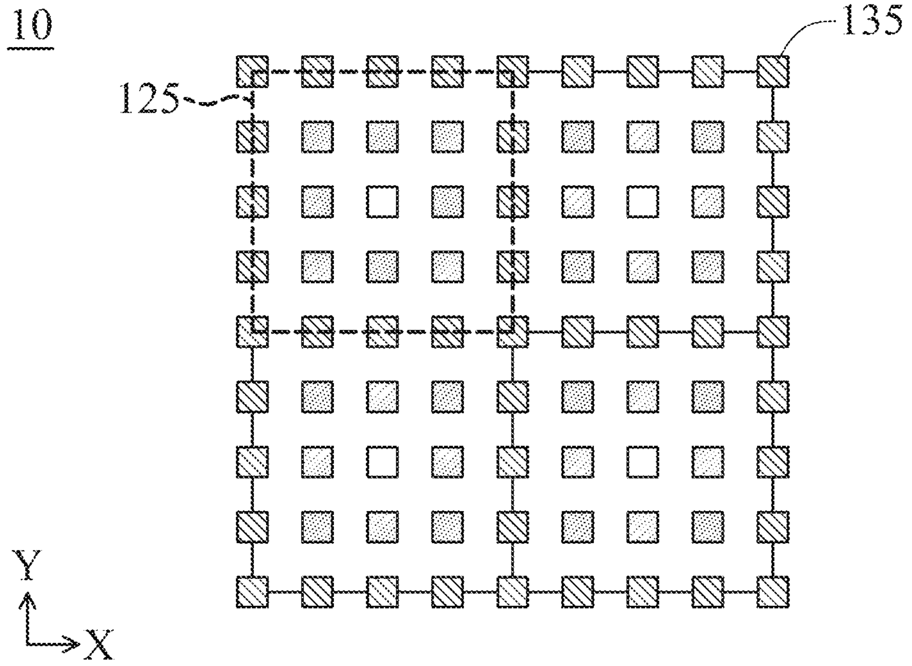
Figure 5C:
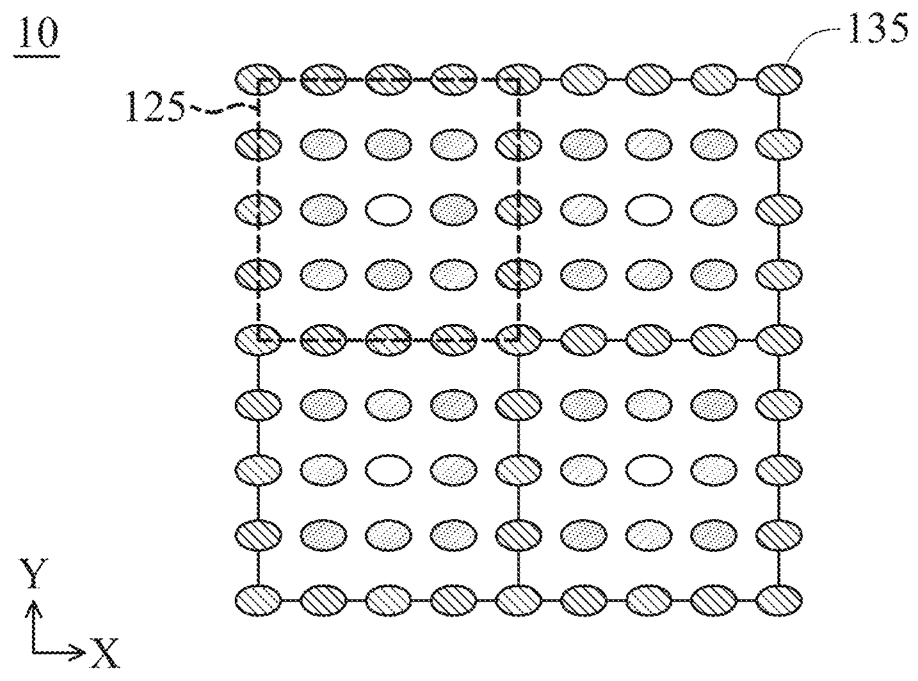
Figure 5D:
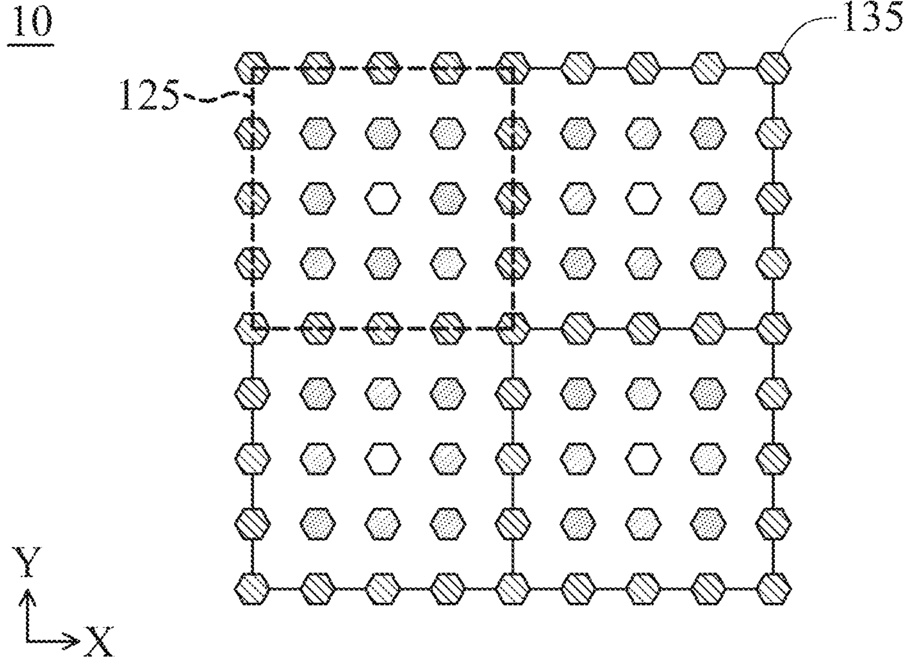

FIGS. 4A, 4B, and 4C illustrate fragmentary top views of the image sensor 10 according to some embodiments of the present disclosure. In some embodiments, the meta-structure region 125 has $n^2$ meta-structures 135, and n is natural number. More specifically, FIGS. 4A, 4B, and 4C illustrate the embodiments of the meta-structure region 125 with $6^2$ meta-structures 135. FIG. 4A illustrates the fragmentary top view at the array center 120 and thus the relevant shifting values are close to zero. In some embodiments, as shown in FIGS. 4B and 4C, the first set 140 of the meta-structures 135 may be rotated at the angle P around the center 130 of the meta-structure region 125. In some embodiments, as shown in FIG. 4B, a second set 145 of the meta-structures 135 may be rotated at the angle P around the center 130 of the meta-structure region 125, and the first set 140 of the meta-structures 135 surrounds the second set 145 of the meta-structures 135. In some embodiments, as shown in FIG. 4B, the angle P of the first set 140 is equal to the angle P of the second set 145. In other embodiments, the angle P of the first set 140 is different from the angle P of the second set 145. In other embodiments, the difference between the angle P of the first set 140 and the angle P of the second set 145 is less than 90 degrees. In some embodiments, as shown in FIG. 4C, a second set 145 of the meta-structures 135 may not be rotated and remains in its original position, and the first set 140 of the meta-structures 135 surrounds the second set 145 of the meta-structures 135. In some embodiments, a difference in the angle P of the meta-structure region 125 of two adjacent pixels 103 is less than about 30 degrees.

FIGS. 5A, 5B, 5C, and 5D illustrate fragmentary top views of the image sensor 10 according to some embodiments of the present disclosure. In some embodiments, the meta-structure region 125 has a plurality of meta-structures 135, and the shape of the meta-structures 135 is a cylinder, a prism, an ellipse, or a polygonal column, as shown in FIGS. 5A, 5B, 5C, and 5D, respectively.

Figure 6A:
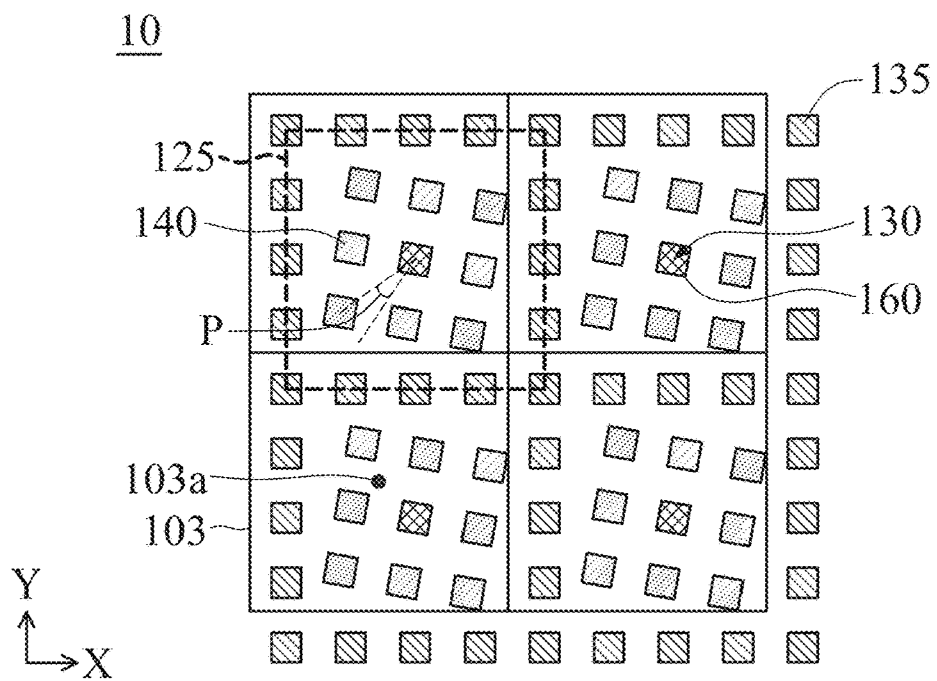
FIGS. 6A, 6B, and 6C illustrate fragmentary top views of the image sensor according to some embodiments of the present disclosure.
Figure 6B:
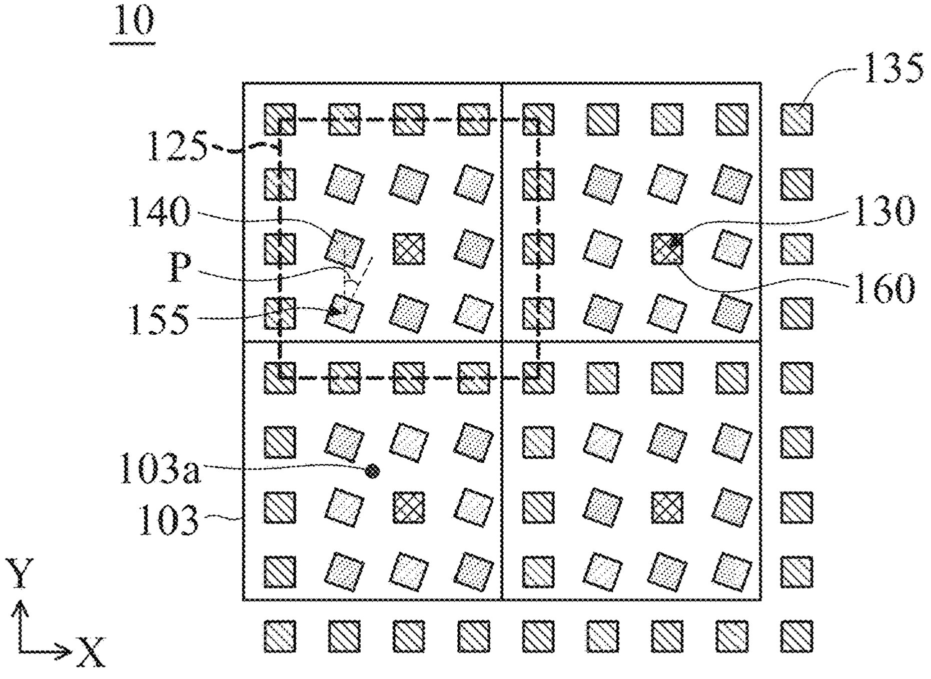
Figure 6C:
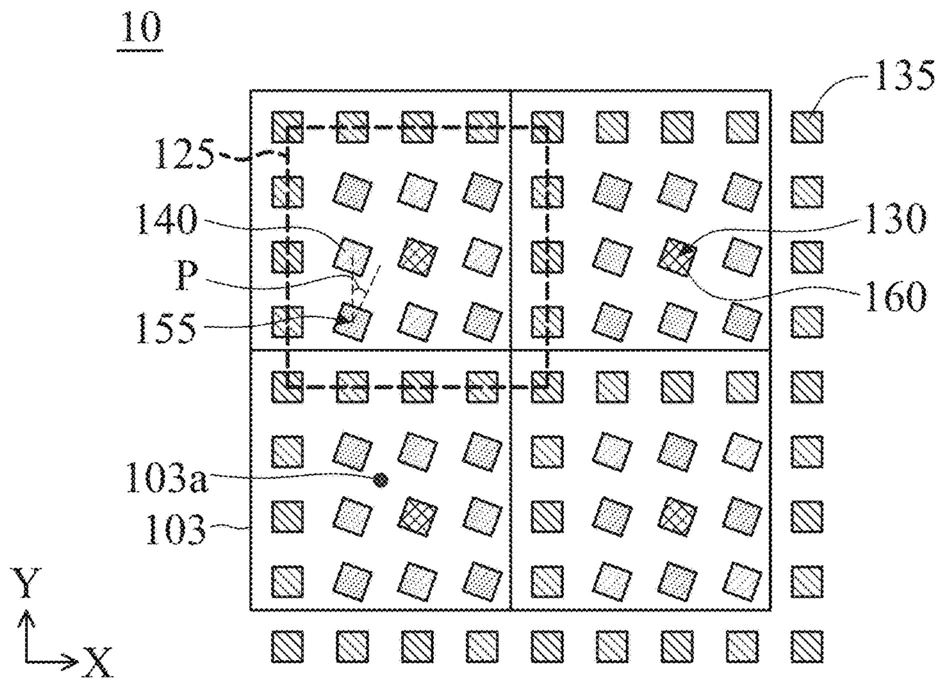

FIGS. 6A, 6B, and 6C illustrate fragmentary top views of the image sensor 10 according to some embodiments of the present disclosure. More specifically, FIGS. 6A, 6B, and 6C illustrate the embodiments of the shape of the meta-structures 135 is a prism, and the meta-structure region 125 has $5^2$ meta-structures 135. In some embodiments, the meta-structures 135 rotate at an angle P, and the angle P satisfies the following equation (3):

$$P = \tan^{-1}\frac{b}{a}, \text{ when } a > 0 \quad (3)$$

-continued $$P = 90, \text{ when } a = 0 \text{ and } b > 0$$

$$P = 270, \text{ when } a = 0 \text{ and } b < 0$$

As shown in FIG. 6A, the meta-structure region 125 has a first set 140 of the meta-structures 135, the entire first set 140 is rotated at the angle P around the center 130 of the meta-structure region 125. Further, as shown in FIG. 6A, a third set 160 of the meta-structures 135 (the single meta-structures 135 at the center 130 in FIG. 6A) is also rotated at the angle P around the center 130 of the meta-structure region 125, and the first set 140 of the meta-structures 135 surrounds the third set 160 of the meta-structures 135. In some embodiments, as shown in FIG. 6B, each of the meta-structures 135 in the first set 140 is rotated by the same rotation angle around its respective center 155. Further, as shown in FIG. 6B, the third set 160 of the meta-structures 135 is not rotated and remains in its original position, and the first set 140 of the meta-structures 135 surrounds the third set 160 of the meta-structures 135. In some embodiments, as shown in FIG. 6C, each of the meta-structures 135 in the first set 140 and the third set 160 is rotated by the same rotation angle around its respective center 155. In some embodiments, the angle P of the first set 140 is different from the angle P of the third set 160. In some embodiments, the difference between the angle P of the first set 140 and the angle P of the third set 160 is less than 90 degrees.

Figure 7A:
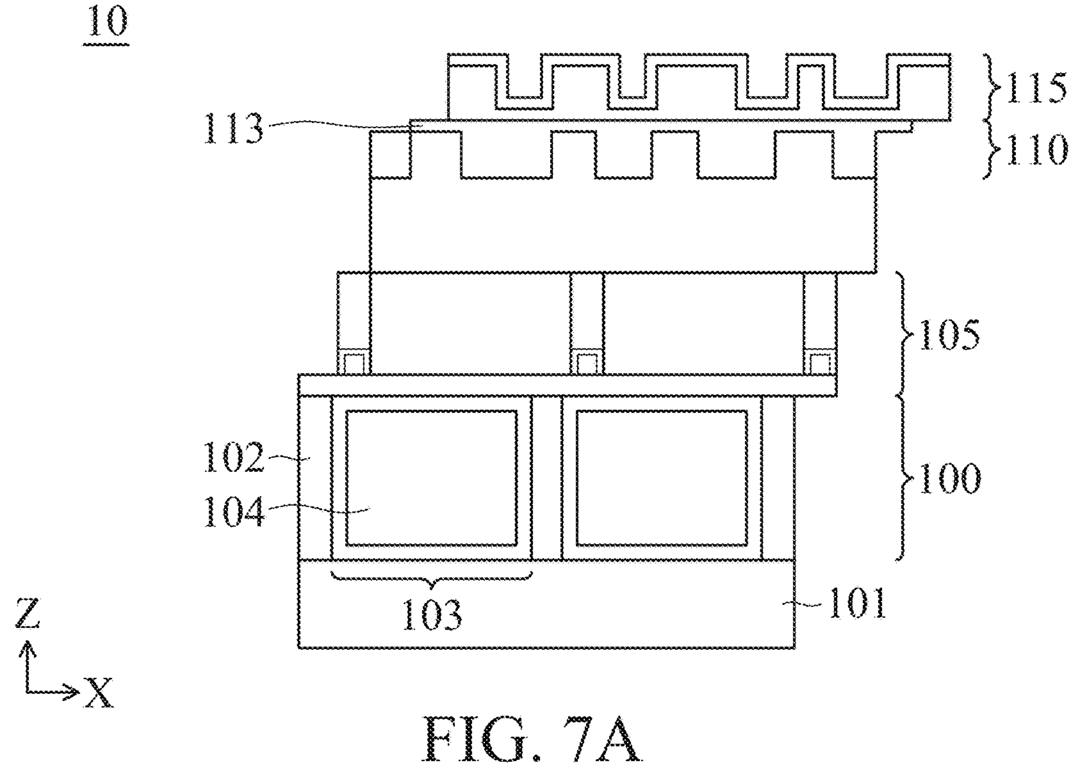
FIGS. 7A, 7B, and 7C illustrate cross-sectional views of the image sensor according to some embodiments of the present disclosure.
Figure 7B:
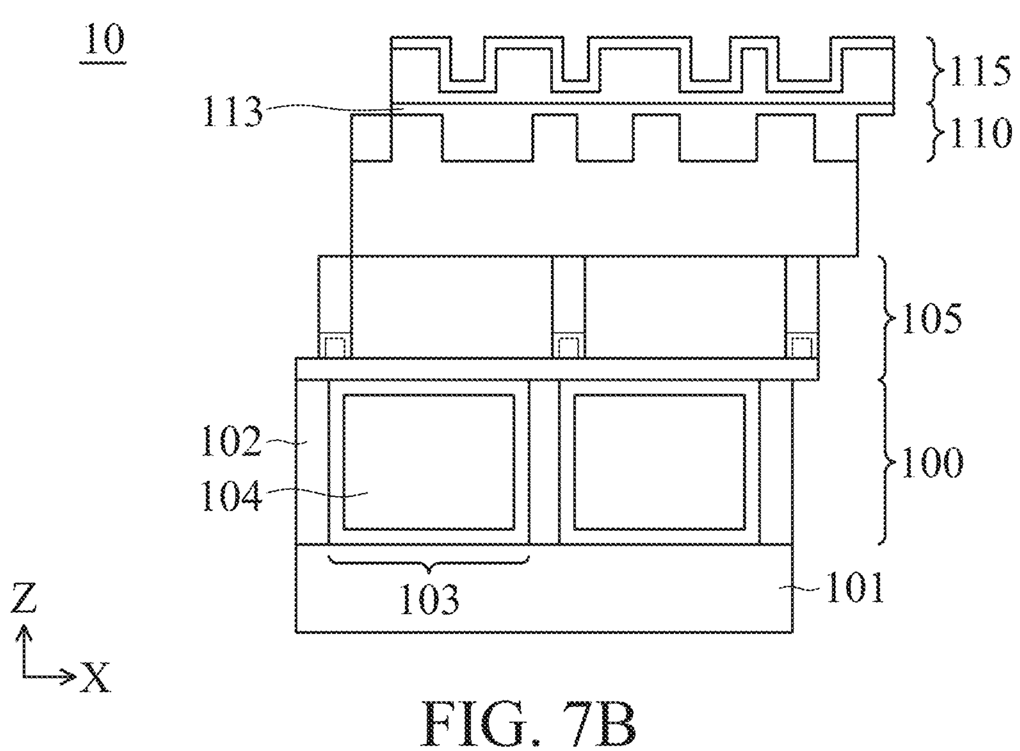
Figure 7C:
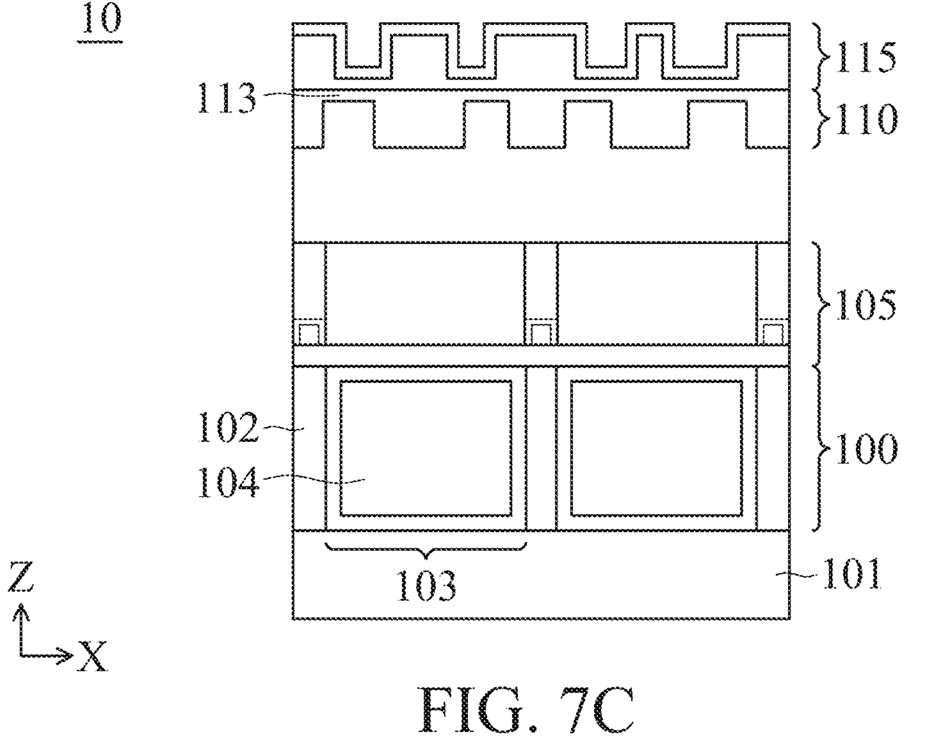

FIGS. 7A, 7B, and 7C illustrate cross-sectional views of the image sensor 10 according to some embodiments of the present disclosure. As described in FIGS. 1 and 2, the shifting value S1, the shifting value S2, and the shifting value S3 increase with the distance from the array center 120. Further, the percentage of shifting H is from 0 to 1, grouped into 100 sections at most. FIG. 7A illustrates the cross-sectional view at an edge of the image sensor 10. FIG. 7C illustrates the cross-sectional view at the array center 120. FIG. 7B illustrates the cross-sectional view between FIGS. 7A and 7C. More specifically, in some embodiments, the shifting value S3 of FIG. 7A is greater than the shifting value S3 of FIG. 7B, and the shifting value S3 of FIG. 7B is greater than the shifting value S3 of FIG. 7C. In some embodiments, the shifting value S2 of FIG. 7A is greater than the shifting value S2 of FIG. 7B, and the shifting value S2 of FIG. 7B is greater than the shifting value S2 of FIG. 7C. In some embodiments, the shifting value S1 of FIG. 7A is greater than the shifting value S1 of FIG. 7B, and the shifting value S1 of FIG. 7B is greater than the shifting value S1 of FIG. 7C. In some embodiments, the shifting value S1 satisfies S1≤0.5*PS, wherein PS is a dimension of each of the pixels 103.

Figure 8A:
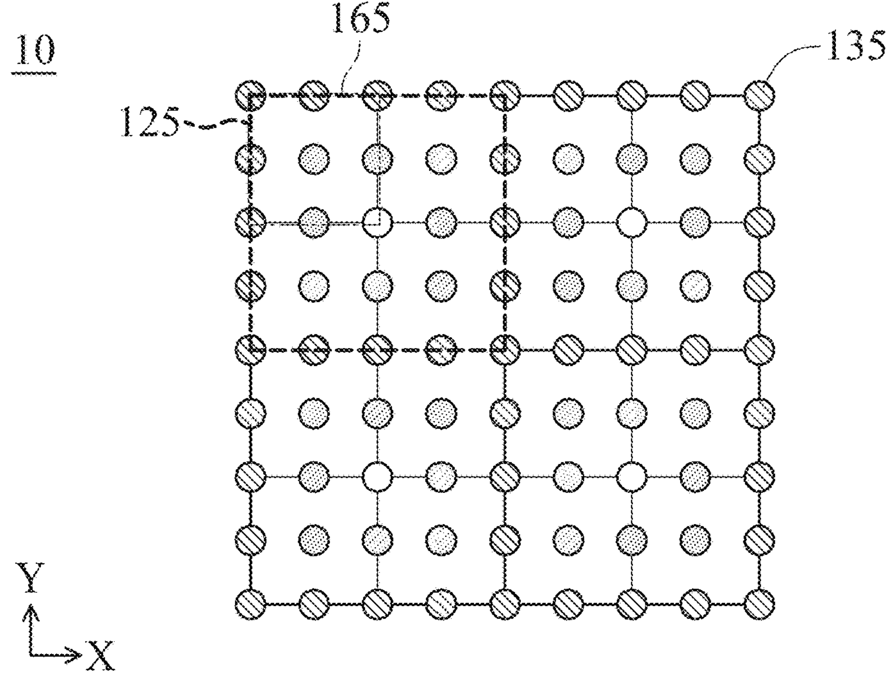
FIGS. 8A and 8B illustrate fragmentary top views of the image sensor according to some embodiments of the present disclosure.
Figure 8B:
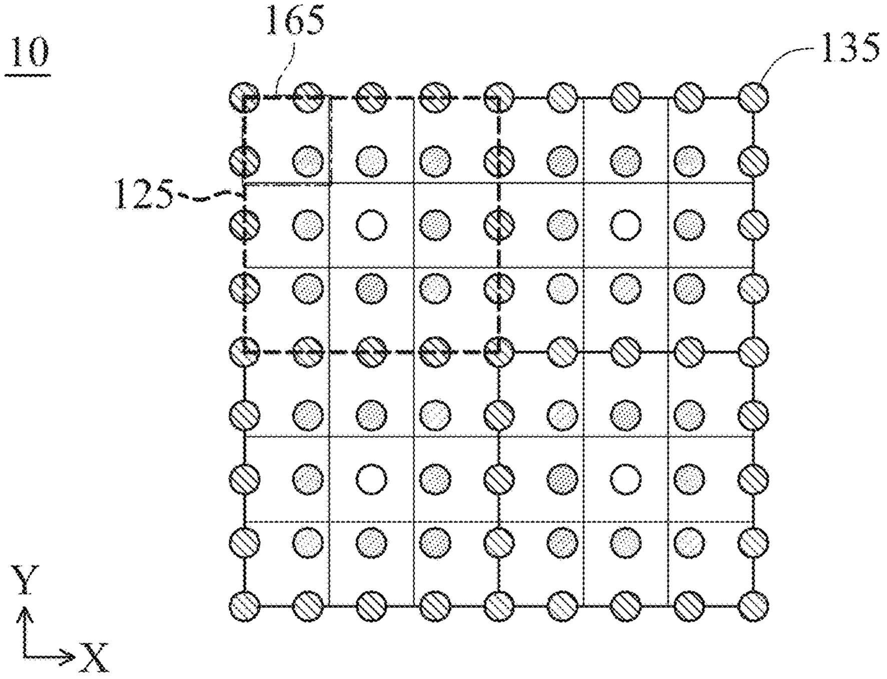

FIGS. 8A and 8B illustrate fragmentary top views of the image sensor 10 according to some embodiments of the present disclosure. In some embodiments, each of the pixels 103 has $c^2$ cells, and c is natural number. For example, FIG. 8A illustrates the embodiments of the pixels 103 with $2^2$ cells 165, and the meta-structure region 125 has $5^2$ meta-structures 135. For example, FIG. 8B illustrates the embodiments of the pixels 103 with $3^2$ cells 165, and the meta-structure region 125 has $5^2$ meta-structures 135.

Figure 9A:
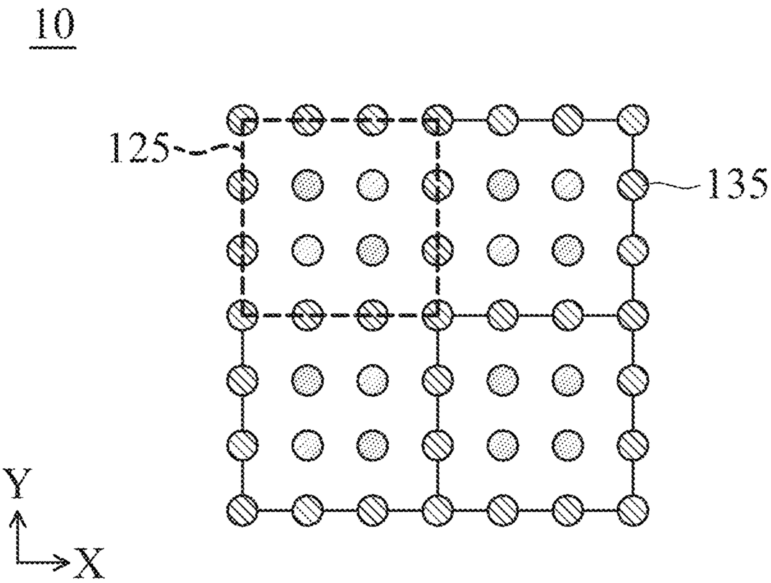
FIGS. 9A, 9B, 9C, 9D, 9E, and 9F illustrate fragmentary top views of the image sensor according to some embodiments of the present disclosure.
Figure 9B:
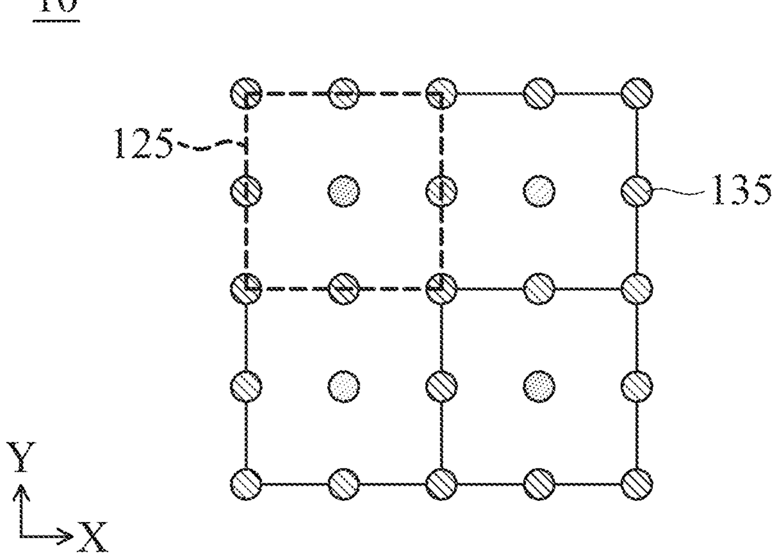
Figure 9C:
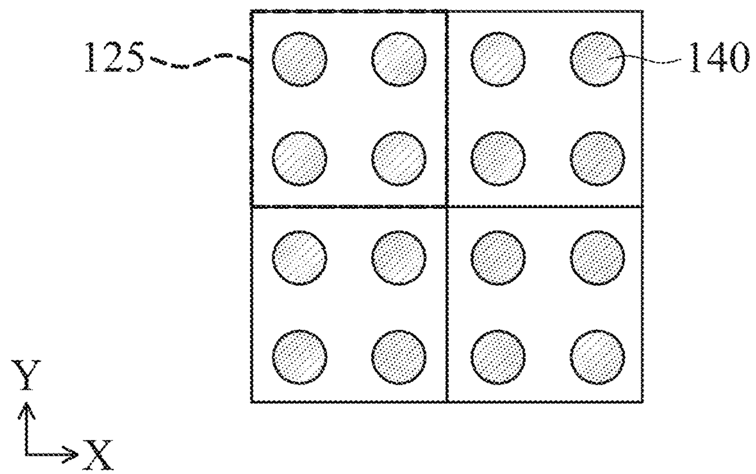
Figure 9D:
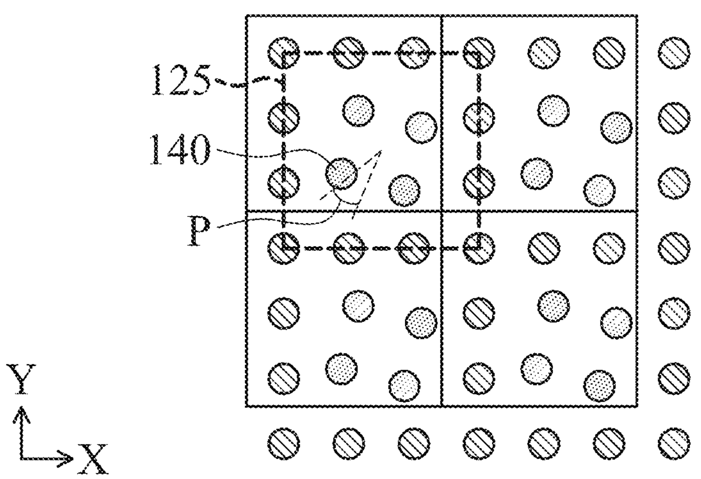
Figure 9E:
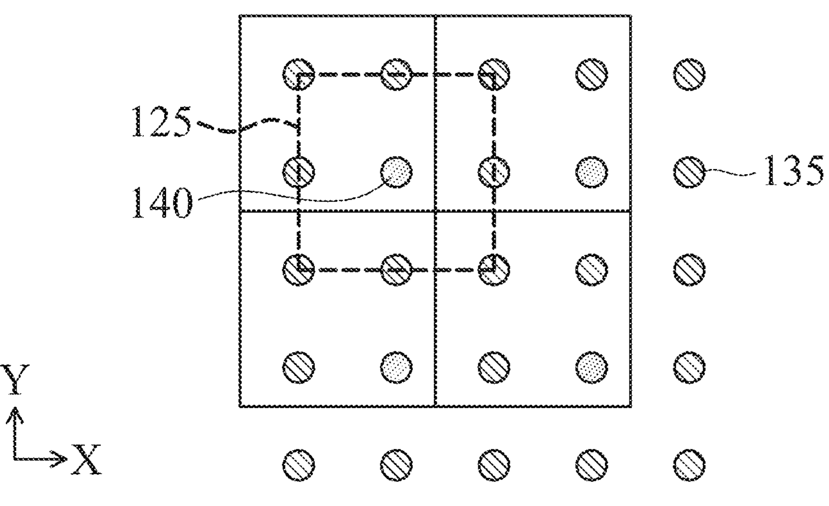
Figure 9F:
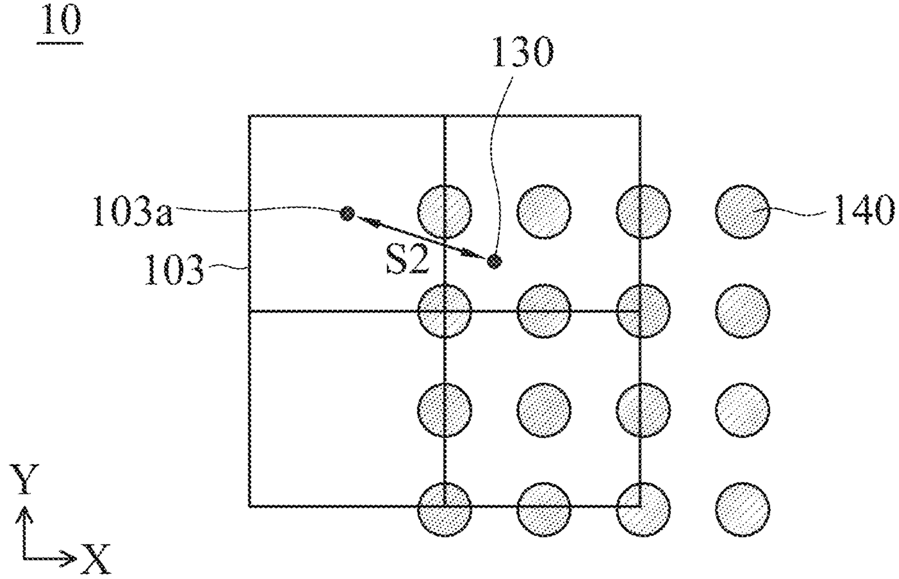

FIGS. 9A, 9B, 9C, 9D, 9E, and 9F illustrate fragmentary top views of the image sensor 10 according to some embodiments of the present disclosure. In some embodiments, the meta-structure region 125 has $n^2$ meta-structures 135, and n is natural number. For example, FIGS. 9A and 9D illustrate the embodiments of the meta-structure region 125 with $4^2$ meta-structures 135. For example, FIGS. 9B and 9E illustrate the embodiments of the meta-structure region 125 with $3^2$ meta-structures 135. For example, FIGS. 9C and 9F illustrate the embodiments of the meta-structure region 125 with $2^2$ meta-structures 135. More specifically, FIGS. 9A, 9B, and 9C illustrate the fragmentary top views at the array center 120. FIGS. 9D, 9E, and 9F illustrate the fragmentary top views at the edge of the image sensor 10. Further, FIG. 9D illustrates the embodiments of the first set 140 of the meta-structures 135 rotated at the angle P around the center 130 of the meta-structure region 125. In some embodiments, as shown in FIG. 9F, when the meta-structure region 125 includes $2^2$ meta-structures 135 (i.e., the first set 140), the shifting value S2 is corresponding to the distance between the center 130 of the meta-structure region 125 and the center 103*a* of each of the pixels 103.

In summary, the embodiment of the present disclosure provides a design of the meta-surface layer, including an additional global shifting, an additional inner shifting, and an additional angle rotation of the meta-surface layer, such that the photodiodes in the center and edges of the image sensor may have the same sensing ability. In other words, by varying the arrangement of the meta-structures, the performance of the image sensor 10 and/or the image quality may be improved. Thus, the various embodiments described herein offer several advantages over the existing art. It will be understood that not all advantages have been necessarily discussed herein, no particular advantage is required for all embodiments, and other embodiments may offer different advantages.

The embodiments of the present disclosure provides an image sensor, including an array of pixels, each of the pixels includes a sensor layer and a color filter layer disposed on the sensor layer. Each of the pixels further includes a first meta-surface layer disposed over the color filter layer and a second meta-surface layer disposed on the first meta-surface layer. The second meta-surface layer has a meta-structure region corresponding to each of the pixels. The shifting value S1 between the center of the color filter layer and the center of the sensor layer, the shifting value S2 between the center of the first meta-surface layer and the center of the sensor layer, and the shifting value S3 between the center of the second meta-surface layer and the center of the sensor layer increase with the distance from the array center.

In some embodiments, the shifting value S1, the shifting value S2, and the shifting value S3 satisfy the following equations (1), (2-1), (2-2), and (2-3):

$$H = \sqrt{a^2 + b^2} / \sqrt{x^2 + y^2} \tag{1}$$

$$S1 = H * Z(1) \tag{2-1}$$

$$S2 = H * Z(2) \tag{2-2}$$

$$S3 = H * Z(3) \tag{2-3}$$

wherein x is the distance from the array center to the array boundary in the first direction, y is the distance from the array center to the array boundary in the second direction, a is a distance from the center of the meta-structure region to the array center in the first direction, b is a distance from the center of the meta-structure region to the array center in the second direction, H is a percentage of shift, Z(1) is the shifting constant of the color filter layer, Z(2) is the shifting constant of the first meta-surface layer, Z(3) is the shifting constant of the second meta-surface layer, and the first direction is perpendicular to the second direction. In some embodiments, a is less than x, and b is less than y. In some embodiments, Z(3) is greater than Z(1) and Z(2), and Z(3) satisfies $Z(3) \leq 1.2*PS$, wherein PS is a dimension of each of the pixels. In some embodiments, H is from 0 to 1, grouped into 100 sections at most.

In some embodiments, a plurality of meta-structures of the meta-structure region rotate at an angle P, and the angle P satisfies the following equation (3):

$$P = \tan^{-1}\frac{b}{a}, \text{ when } a > 0 \quad (3)$$
$$P = 90, \text{ when } a = 0 \text{ and } b > 0$$
$$P = 270, \text{ when } a = 0 \text{ and } b < 0.$$

In some embodiments, a first set of meta-structures is rotated at the angle P around the center of the meta-structure region. In some embodiments, a second set of meta-structures is rotated at the angle P around the center of the meta-structure region, and the first set of meta-structures surrounds the second set of meta-structures. In some embodiments, a difference in the angle P of the meta-structure region of two adjacent pixels is less than about 30 degrees.

In some embodiments, the meta-structure region has a plurality of meta-structures, and the shape of the meta-structures is a cylinder, a prism, an ellipse, or a polygonal column. In some embodiments, the meta-structures rotate at an angle P, and the angle P satisfies the following equation (3):

$$P = \tan^{-1}\frac{b}{a}, \text{ when } a > 0 \quad (3)$$
$$P = 90, \text{ when } a = 0 \text{ and } b > 0$$
$$P = 270, \text{ when } a = 0 \text{ and } b < 0.$$

In some embodiments, the meta-structure region has a first set of meta-structures, and each of the meta-structures in the first set is rotated at the angle P around its respective center. In some embodiments, a third set of meta-structures is rotated at the angle P around the center of the meta-structure region. In some embodiments, angle P of the first set is different than angle P of the third set.

In some embodiments, the shifting value S1 satisfies $S1 \leq 0.5*PS$, wherein PS is a dimension of each of the pixels. In some embodiments, each of the pixels has $c^2$ cells, and wherein c is natural number. In some embodiments, the color filter layer is red color filter segment, green color filter segment, blue color filter segment, yellow color filter segment, white color filter segment, cyan color filter segment, magenta color filter segment, or infrared (IR)/near infrared (NIR) color filter segment. In some embodiments, the refractive index of the second meta-surface layer is about 1.6 to 2.6. In some embodiments, the image sensor further includes an internal space layer disposed between the first meta-surface layer and the second meta-surface layer, wherein the refractive index of the internal space layer is the same as the refractive index of the second meta-surface layer. In some embodiments, the meta-structure region has $n^2$ meta-structures, and wherein n is natural number.

The scope of the present disclosure is not limited to the technical solutions consisting of specific combinations of the technical features described above, but should also cover other technical solutions consisting of any combinations of the technical features described above or their equivalent features, all of which are within the scope of the protection of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the prior art will recognize, in light of the description herein, that the disclosure can be practiced without one or more of the specific features or advantages of a particular embodiment. In other instances, additional features and advantages may be recognized in certain embodiments that may not be present in all embodiments of the disclosure.

What is claimed is:

1. An image sensor, comprising:

an array of pixels, wherein each of the pixels comprises:

a sensor layer;

a color filter layer disposed on the sensor layer;

a first meta-surface layer disposed over the color filter layer; and a second meta-surface layer disposed on the first meta-surface layer, wherein the second meta-surface layer has a meta-structure region corresponding to each of the pixels, and wherein a shifting value S1 between a center of the color filter layer and a center of the sensor layer, a shifting value S2 between a center of the first meta-surface layer and the center of the sensor layer, and a shifting value S3 between a center of the second meta-surface layer and the center of the sensor layer all increase with a distance from an array center, wherein the shifting value S1, the shifting value S2, and the shifting value S3 satisfy the following equations (1), (2-1), (2-2), and (2-3):

$$H = \sqrt{a^2 + b^2} / \sqrt{x^2 + y^2} \quad (1)$$

$$S1 = H * Z(1) \quad (2\text{-}1)$$

$$S2 = H * Z(2) \quad (2\text{-}2)$$

$$S3 = H * Z(3) \quad (2\text{-}3)$$

wherein x is a distance from the array center to an array boundary in a first direction, y is a distance from the array center to an array boundary in a second direction, a is a distance from a center of the meta-structure region to the array center in the first direction, b is a distance from the center of the meta-structure region to the array center in the second direction, H is a percentage of shifting, Z(1) is a shifting constant of the color filter layer, Z(2) is a shifting constant of the first meta-surface layer, Z(3) is a shifting constant of the second meta-surface layer, and the first direction is perpendicular to the second direction, wherein a plurality of meta-structures of the meta-structure region rotate at an angle P, and the angle P satisfies the following equation (3):

$$P = \tan^{-1}\frac{b}{a}, \text{ when } a > 0 \quad (3)$$

$$P = 90, \text{ when } a = 0 \text{ and } b > 0$$

$$P = 270, \text{ when } a = 0 \text{ and } b < 0.$$

2. The image sensor as claimed in claim 1, wherein a is less than x, and b is less than y.

3. The image sensor as claimed in claim 1, wherein Z(3) is greater than Z(1) and Z(2), and Z(3) satisfies Z(3)≤1.2×PS, wherein PS is a dimension of each of the pixels.

4. The image sensor as claimed in claim 1, wherein H is from 0 to 1, grouped into 100 sections at most.

5. The image sensor as claimed in claim 1, wherein a first set of the meta-structures is rotated at the angle P around the center of the meta-structure region.

6. The image sensor as claimed in claim 5, wherein a second set of the meta-structures is rotated at the angle P around the center of the meta-structure region, and wherein the first set of the meta-structures surrounds the second set of the meta-structures.

7. The image sensor as claimed in claim 1, wherein a difference in the angle P of the meta-structure region of two adjacent ones of the pixels is less than about 30 degrees.

8. The image sensor as claimed in claim 1, wherein the meta-structure region has a plurality of meta-structures, and wherein a shape of the meta-structures is a cylinder, a prism, an ellipse, or a polygonal column.

9. The image sensor as claimed in claim 8, wherein the meta-structures rotate at an angle P, and the angle P satisfies the following equation (3):

$$P = \tan^{-1}\frac{b}{a}, \text{ when } a > 0 \quad (3)$$

$$P = 90, \text{ when } a = 0 \text{ and } b > 0$$

$$P = 270, \text{ when } a = 0 \text{ and } b < 0.$$

10. The image sensor as claimed in claim 9, wherein the meta-structure region has a first set of the meta-structures, and each of the meta-structures in the first set is rotated at the angle P around its respective center.

11. The image sensor as claimed in claim 10, wherein a third set of the meta-structures is rotated at the angle P around the center of the meta-structure region.

12. The image sensor as claimed in claim 11, wherein the angle P of the first set is different to the angle P of the third set.

13. The image sensor as claimed in claim 1, wherein the shifting value S1 satisfies S1=0.5×FS, wherein PS is a dimension of each of the pixels.

14. The image sensor as claimed in claim 1, wherein each of the pixels has $c^2$ cells, and wherein c is natural number.

15. The image sensor as claimed in claim 1, wherein the color filter layer is a red color filter segment, a green color filter segment, a blue color filter segment, a yellow color filter segment, a white color filter segment, a cyan color filter segment, a magenta color filter segment, or an infrared (IR)/near infrared (NIR) color filter segment.

16. The image sensor as claimed in claim 1, wherein a refractive index of the second meta-surface layer is about 1.6 to 2.6.

17. The image sensor as claimed in claim 1, further comprising:

an internal space layer disposed between the first meta-surface layer and the second meta-surface layer, wherein a refractive index of the internal space layer is the same as a refractive index of the second meta-surface layer.

18. The image sensor as claimed in claim 1, wherein the meta-structure region has $n^2$ meta-structures, and wherein n is natural number.

* * * * *